(12) United States Patent
Hush et al.

(10) Patent No.: US 6,731,528 B2
(45) Date of Patent: May 4, 2004

(54) DUAL WRITE CYCLE PROGRAMMABLE CONDUCTOR MEMORY SYSTEM AND METHOD OF OPERATION

(75) Inventors: Glen Hush, Boise, ID (US); Kevin G. Duesman, Boise, ID (US); Steve Casper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/137,554

(22) Filed: May 3, 2002

(65) Prior Publication Data

US 2003/0206433 A1 Nov. 6, 2003

(51) Int. Cl.⁷ ............................................. G11C 11/00
(52) U.S. Cl. ..................... 365/100; 365/148; 365/163; 365/222
(58) Field of Search ................................ 365/100, 148, 365/163, 145, 149, 222

(56) References Cited

U.S. PATENT DOCUMENTS

| | | |
|---|---|---|
| 3,622,319 A | 11/1971 | Sharp |
| 3,743,847 A | 7/1973 | Boland |
| 4,112,512 A | 9/1978 | Arzubi et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,671,618 A | 6/1987 | Wu et al. |
| 4,795,657 A | 1/1989 | Formigoni et al. |
| 4,800,526 A | 1/1989 | Lewis |

(List continued on next page.)

FOREIGN PATENT DOCUMENTS

| | | |
|---|---|---|
| EP | 1 109 170 A2 | 6/2001 |
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

(List continued on next page.)

Primary Examiner—Son Mai
(74) Attorney, Agent, or Firm—Dickstein Shapiro Morin & Oshinsky LLP

(57) ABSTRACT

The present invention provides a method and apparatus for writing a programmable conductor random access memory (PCRAM) element. After a read operation of the memory element a complement logical state from that read is written back to the memory element. In one embodiment the memory element is then again written back to its original state. In another embodiment logic circuitry keeps track of whether the original logic state or its complement are stored in the memory element so that during the next read the stored logic will be correctly read.

42 Claims, 9 Drawing Sheets

U.S. PATENT DOCUMENTS

| | | | |
|---|---|---|---|
| 4,847,674 A | | 7/1989 | Sliwa et al. |
| 5,177,567 A | | 1/1993 | Klersy et al. |
| 5,219,788 A | | 6/1993 | Abernathey et al. |
| 5,238,862 A | | 8/1993 | Blalock et al. |
| 5,272,359 A | | 12/1993 | Nagasubramanian et al. |
| 5,314,772 A | | 5/1994 | Kozicki |
| 5,315,131 A | | 5/1994 | Kishimoto et al. |
| 5,350,484 A | | 9/1994 | Gardner et al. |
| 5,360,981 A | | 11/1994 | Owen et al. |
| 5,500,532 A | | 3/1996 | Kozicki et al. |
| 5,512,328 A | | 4/1996 | Yoshimura et al. |
| 5,512,773 A | | 4/1996 | Wolf et al. |
| 5,561,626 A | * | 10/1996 | Fujii ......................... 365/149 |
| 5,699,293 A | | 12/1997 | Tehrani et al. |
| 5,726,083 A | | 3/1998 | Takaishi |
| 5,748,547 A | * | 5/1998 | Shau ......................... 365/222 |
| 5,751,012 A | | 5/1998 | Wolstenholme et al. |
| 5,761,115 A | | 6/1998 | Kozicki et al. |
| 5,789,277 A | | 8/1998 | Zahorik et al. |
| 5,818,749 A | | 10/1998 | Harshfield |
| 5,841,150 A | | 11/1998 | Gonzalez et al. |
| 5,846,889 A | | 12/1998 | Harbison et al. |
| 5,883,827 A | | 3/1999 | Morgan |
| 5,896,312 A | | 4/1999 | Kozicki et al. |
| 5,914,893 A | | 6/1999 | Kozicki et al. |
| 5,920,788 A | | 7/1999 | Reinberg |
| 5,998,066 A | | 12/1999 | Block et al. |
| 6,072,716 A | | 6/2000 | Jacobson et al. |
| 6,077,729 A | | 6/2000 | Harshfield |
| 6,084,796 A | | 7/2000 | Kozicki et al. |
| 6,117,720 A | | 9/2000 | Harshfield |
| 6,143,604 A | | 11/2000 | Chiang et al. |
| 6,177,338 B1 | | 1/2001 | Liaw et al. |
| 6,191,972 B1 | | 2/2001 | Miura et al. |
| 6,191,989 B1 | | 2/2001 | Luk et al. |
| 6,236,059 B1 | | 5/2001 | Wolstenholme et al. |
| 6,243,311 B1 | | 6/2001 | Keeth |
| 6,297,170 B1 | | 10/2001 | Gabriel et al. |
| 6,300,684 B1 | | 10/2001 | Gonzalez et al. |
| 6,316,784 B1 | | 11/2001 | Zahorik et al. |
| 6,329,606 B1 | | 12/2001 | Freyman et al. |
| 6,348,365 B1 | | 2/2002 | Moore et al. |
| 6,350,679 B1 | | 2/2002 | McDaniel et al. |
| 6,376,284 B1 | | 4/2002 | Gonzalez et al. |
| 6,388,324 B2 | | 5/2002 | Kozicki et al. |
| 6,391,688 B1 | | 5/2002 | Gonzalez et al. |
| 6,411,541 B2 | * | 6/2002 | Maruyama ................ 365/145 |
| 6,414,376 B1 | | 7/2002 | Thakur et al. |
| 6,418,049 B1 | | 7/2002 | Kozicki et al. |
| 6,423,628 B1 | | 7/2002 | Li et al. |
| 6,462,981 B2 | | 10/2002 | Numata et al. |
| 6,469,364 B1 | | 10/2002 | Kozicki |
| 6,473,332 B1 | | 10/2002 | Ignatiev et al. |
| 6,487,106 B1 | | 11/2002 | Kozicki |
| 2002/0000666 A1 | | 1/2002 | Kozicki et al. |
| 2002/0072188 A1 | | 6/2002 | Gilton |
| 2002/0106849 A1 | | 8/2002 | Moore |
| 2002/0123169 A1 | | 9/2002 | Moore et al. |
| 2002/0123170 A1 | | 9/2002 | Moore et al. |
| 2002/0123248 A1 | | 9/2002 | Moore et al. |
| 2002/0127886 A1 | | 9/2002 | Moore et al. |
| 2002/0132417 A1 | | 9/2002 | Li |
| 2002/0163828 A1 | | 11/2002 | Krieger et al. |
| 2002/0168820 A1 | | 11/2002 | Kozicki |
| 2002/0168852 A1 | | 11/2002 | Harshfield et al. |
| 2002/0190289 A1 | | 12/2002 | Harshfield et al. |
| 2002/0190350 A1 | | 12/2002 | Kozicki |
| 2003/0001229 A1 | | 1/2003 | Moore et al. |
| 2003/0027416 A1 | | 2/2003 | Moore |
| 2003/0032254 A1 | | 2/2003 | Gilton |
| 2003/0035314 A1 | | 2/2003 | Kozicki |
| 2003/0035315 A1 | | 2/2003 | Kozicki |
| 2003/0038301 A1 | | 2/2003 | Moore |
| 2003/0043631 A1 | | 3/2003 | Gilton et al. |
| 2003/0045049 A1 | | 3/2003 | Campbell et al |
| 2003/0045054 A1 | | 3/2003 | Campbell et al. |
| 2003/0047765 A1 | | 3/2003 | Campbell |
| 2003/0047772 A1 | | 3/2003 | Li |
| 2003/0047773 A1 | | 3/2003 | Li |
| 2003/0048519 A1 | | 3/2003 | Kozicki |
| 2003/0049912 A1 | | 3/2003 | Campbell et al. |
| 2003/0068861 A1 | | 4/2003 | Li |
| 2003/0068862 A1 | | 4/2003 | Li |
| 2003/0095426 A1 | | 5/2003 | Hush et al. |
| 2003/0096497 A1 | | 5/2003 | Moore et al. |
| 2003/0107105 A1 | | 6/2003 | Kozicki |
| 2003/0117831 A1 | | 6/2003 | Hush |
| 2003/0128612 A1 | | 7/2003 | Moore et al |
| 2003/0137869 A1 | | 7/2003 | Kozicki |
| 2003/0143782 A1 | | 7/2003 | Gilton et al. |
| 2003/0156447 A1 | | 8/2003 | Kozicki |
| 2003/0156463 A1 | | 8/2003 | Casper et al. |

OTHER PUBLICATIONS

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5l: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RgAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidiy percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfind Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2672.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemicall durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Propeties of Ag2–xSe1+x/n–Si diodes, Thin Solid Films 110 (1983) 107–113.

El Gharras, Z.; Bourahla, A.; Vautier, C., Role of Photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, U.L., The threshold switching in semiconducting glass Ge21Se17Te62, Indian J. Phys. 70a (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A Unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shari, H.T., Electrical, thermal and optical properties of Se75Ge7Sb18, Vacuum 43 (1992) 253–257.

Feng, X. ;Bresser, W.J.; Boolchand, P., Directed evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) curently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys 28 (1989) 1013–1018.

Guin, J.-P.; Rouxel, T.; Keryvin, V.; Sangleboeuf, J.-C.; Serre, I.; Lucas, J., Indentation creep of Ge–Se chalcogenide glasses below Tg: elastic recovery and non–Newtonian flow, J. Non Cryst. Solids 298 (2002) 260–269.

Guin, J.-P.; Rouxel, T.; Sangleboeuf, J.-C; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the strucure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen A.E. Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structuress, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys 13 (1974) 1163–1164.

Hegab, N.A.; Fadel, M.; Sedeek, K., Memory switching pehnomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectroncis and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull 8 (1973) 433–442.

Kaplan, T.; Adler, D., Electrothermal switching in amorphous semiconductors. J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kluge, G.; Thomas, A.; Klabes, R.; Grotzschel, R., Silver photodiffusion in amorphous GexSe100-x, J. Non–Cryst. Solids 124 (1990) 186–193.

Kolobov, A.V., On the origin of p–type conductivity in amorphous chalcogenides, J. Non–Cryst. Solids 198–200 (1996) 729–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalocogenide glass polarization and the type of contacts, J. Non–Cryst. Solids 194 (1996) 256–259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar. A., Amorphous semiconductor devices: memory and switching mechanism, J. Instn Electronics & Telecom. Engrs 27 (1981) 16–19.

Lal, M.; Goyal N., Chemical bond approach to study the memory and threshold switching chalcogenide glasses, Indian Journal of pure & appl. phys. 29 (1991) 303–304.

Leimer, R.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett., 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef. A., Electrical characterization of M/Se structures (M=Ni, Bi), Mat. Chem. And Phys 28 (1991) 253–258.

Mitkova, M.; Boolchand, P., Microscopic origin of the glass forming tendency in chalogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitokova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys 15 (1976) 849–853.

Narayanan, R.A.; Asokan, S.; Kumar, A., Evidence concerning the effect of topology on electrical switching in chalcogenide network glasses, Phys. Rev. B54 (1996) 4413–4415.

Neale, R.G.; Aseltine, J.A., The application of amorphous meterials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys 29 (1996) 2004–2008.

Rahman, S.; Silvarama Sastry, G., Electronic switching in Ge–Bi–Se–Te glasses, Mat. Sci. and Eng. B12 (1992) 219–222.

Ramesh, K.; Asokan. S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen, A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects of non–volatility in a–Si:H Memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh. B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys 8 (1975) L120–L122.

Steventon, A.G., The switching mechanism in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenid, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High performance Metal/sillicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepares by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchang, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Scheuerlein R. et al., *A 10ns Read and Write Non–Volatile Memory Array Using a Magnetic Tunnel Junction and FET Switch in each Cell,* Digest of Technical Papers. 2000 IEEE Int'l Solid–State Circuits Conference, Session 7, Paper TA 7.2, Feb. 8, 2000, pp. 128–129.

Axon Technologies Corporation, Technology Description: *Programmable Metalization Cell(PMC),* pp. 1–6 (Pre–May 2000).

Helbert et al., *Intralevel hybrid resist process with submicron capability,* SPIE vol. 333 Submicron Lithography, pp. 24–29 (1982).

Hilt, Dissertation: *Materials characterization of Silver Chalcogenide Programmable Metalization Cells,* Arizona State University, pp. Title page–114 (UMI Company, May 1999).

Hirose et al., *High Speed Memory Behavior and Reliability of an Amorphous $As_2S_3$ Film Doped Ag,* Phys. Stat. Sol. (a) 61, pp. 87–90 (1980).

Holmquist et al., *Reaction and Diffusion in Silver–Arsenic Chalcogenide Glass Systems,* 62 J. Amer. Ceram. Soc., No. 3–4, pp. 183–188 (Mar.–Apr. 1979).

Huggett et al., *Development of silver sensitized germanium selenide photoresist by reactive* sputter etching in $SF_6$, 42 Appl. Phys. Lett., No. 7, pp. 592–594 (Apr. 1983).

Kawaguchi et al., *Mechanism of photosurface deposition,* 164–166 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions,* Superlattices and Microstructures, 27, 485–488 (2000).

Kozicki, et al., *Nanoscale phase separation in Ag–Ge–Se glasses,* Microelectronic Engineering, vol. 63/1–3, 155–159 (2002).

M.N. Kozicki and M. Mitkova, *Silver incorporation in thin films of selenium rich Ge–Se glasses,* Proceedings of the XIX International Congress on Glass, Society for Glass Technology, 226–227 (2001).

McHardy et al., *The dissolution of metals in amorphous chalcogenides and the effects o electron and ultraviolet radiation,* 20 J. Phys. C.: Solid State Phys., pp. 4055–4075 (1987)f.

Owen et al., *Metal–Chalcogenide Photoresists for High Resolution Lithography and Sub–Micron Structures,* Nanostructure Physics and Fabrication, pp. 447–451 (M. Reed ed. 1989).

Shimizu et al., *The Photo–Erasable Memory Switching Effect of Ag Photo–Doped Chalcogenide Glasses,* 46 B. Chem Soc. Japan, No. 12, pp. 3662–3365 (1973).

* cited by examiner

| WRITE $V_1=V_{dd}$ | $V_1 - V_2 - V_4 = V_3 = +.25$ |
|---|---|
| ERASE $V_1=GND$ | $V_1 + V_2 - V_4 = V_3 = -.25$ |
| READ | $V_1 - V_2 - V_4 = V_3 = +.2$ |

$V_1$ = 2.5V OR GND
$V_4$ = 1.25V

DUAL WRITE CYCLE PROGRAMMABLE CONDUCTOR MEMORY SYSTEM AND METHOD OF OPERATION

FIELD OF INVENTION

The present invention relates to integrated memory circuits. More specifically, it relates to a method for writing a programmable conductor random access memory (PCRAM) cell.

BACKGROUND OF THE INVENTION

Dynamic random access memory (DRAM) integrated circuit arrays have existed for more than thirty years and their dramatic increase in storage capacity has been achieved through advances in semiconductor fabrication technology and circuit design technology. The tremendous advances in these two technologies have also achieved higher levels of integration that permit dramatic reductions in memory array size and cost, as well as increased process yield.

FIG. 1 is a schematic diagram of a DRAM memory cell 100 comprising an access transistor 101 and a capacitor 102. The capacitor 102, which is coupled to a Vcc/2 potential source and the transistor 101, stores one bit of data in the form of a charge. Typically, a charge of one polarity (e.g., a charge corresponding to a potential difference across the capacitor 102 of +Vcc/2) is stored in the capacitor 102 to represent a binary "1" while a charge of the opposite polarity (e.g., a charge corresponding to a potential difference across the capacitor 102 of −Vcc/2) represents a binary "0." The gate of the transistor 101 is coupled to a word line 103, thereby permitting the word line 103 to control whether the capacitor 102 is conductively coupled via the transistor 101 to a bit line 104. The default state of each word line 103 is at ground potential, which causes the transistor 101 to be switched off, thereby electrically isolating capacitor 102.

One of the drawbacks associated with DRAM cells 100 is that the charge on the capacitor 102 may naturally decay over time, even if the capacitor 102 remains electrically isolated. Thus, DRAM cells 100 require periodic refreshing. Additionally, as discussed below, refreshing is also required after a memory cell 100 has been accessed, for example, as part of a read operation.

Efforts continue to identify other forms of memory elements for us in memory cells, particularly for memory elements which do not required frequent refresh operations. Recent studies have focused on resistive materials that can be programmed to exhibit either high or low stable ohmic states. A programmable resistance element of such material could be programmed (set) to a high resistive state to store, for example, a binary "1" data bit or programmed (set) to a low resistive state to store a binary "0," data bit. The stored data bit could then be read by detecting the magnitude of a readout current switched through the resistive memory element by an access device, thus indicating its programmed stable resistance state.

Recently programmable conductor materials, such as chalcogenide glasses, have been investigated as data storage memory cells for use in memory devices. U.S. Pat. Nos. 5,761,115, 5,896,312, 5,914,893, and 6,084,796 all describe chalcogenide glass materials which can be used as programmable conductor memory elements and are incorporated herein by reference. One characteristic of such an element is that it typically includes a chalcogenide glass which is doped with metal ion and a cathode and anode spaced apart on a surface of the glass. Application of a voltage across the cathode and anode causes the glass to achieve a low resistance state. One theory for this is that the applied voltage causes growth of a nearly non-volatile metal dendrite in or on the surface of the glass which changes the resistance and capacitance of the memory element which can then be used to store data.

One particularly promising programmable conductor material is a chalcogenide glass formed as an alloy system including Ge:Se:Ag for example, a $Ge_x:Se_{(1-x)}$ composition which is doped with silver. A memory element comprised of a chalcogenide glass has a natural stable high resistive state but can be programmed to a low resistance state by passing a current pulse from a voltage of suitable polarity through the cell. A chalcogenide memory element is simply written over by the appropriate current pulse and voltage polarity (reverse of that which writes the cell to a low resistance state) to reprogram it, and thus does not need to be erased. Moreover, a memory element of chalcogenide material is nearly nonvolatile, in that it need only be rarely refreshed in order to retain its programmed low resistance state. Such memory cells, unlike DRAM cells, can be accessed without requiring a refresh.

Since there is a considerable body of known and proven circuitry for reading, writing and refreshing DRAM memory cells, it would be desirable to use the same or similar circuitry with programmable conductor memory elements. However, while conventional read sense amplifier circuitry, associated with DRAM cells, are capable of use in accessing and sensing programmable element random access memory (PCRAM) cells, the natural refresh operation associated with these sense amplifiers is not required for a programmable conductor memory element. Indeed, frequent rewriting of PCRAM memory elements to the same state is not desirable because it can cause the memory element to wear out faster. Accordingly, there is a need and desire for a circuit and method for writing PCRAM cells without causing premature deterioration.

SUMMARY OF THE INVENTION

The present invention provides an improved method for reading a programmable conductor memory element which reduces premature deterioration due to repeated refresh operations. This is accomplished by first performing a read operation on a memory element and then writing the memory element to the opposite or complement logical state from the state which was read and then writing the memory element back to the original logical state. Hence, if following a high resistance state read operation the memory element is to be written to a high resistance state, then the memory element is first written to the opposite state (i.e., low resistance state) and then written back to the original state (i.e., high resistance state). Alternatively, if following a low resistance state read operation the PCRAM cells are to be written to a low resistance state, then the cells are first written to the opposite state (i.e., high resistance state) and then written back to the original state (i.e., low resistance state).

In an alternative embodiment, after a read operation the memory element may simply be re-written to a state complementary to the read state and logic circuitry associated with a memory device containing the memory element keeps track during a read operation if the read data should output as read or after being inverted. For example, if a high resistance state represents a "1" data value and a low resistance state represents a "0" data value, and if a memory element is read as a "1" that memory element will be written to a "0" state following the read operation. During a subsequent read of the same memory element, as a "0" the logic circuitry will invert the logic state and output it correctly as a "1." After the subsequent read, the memory element will then be written to a "1" state and the logic circuit will note that no logical state inversion is required for the next read of the memory element.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 1:
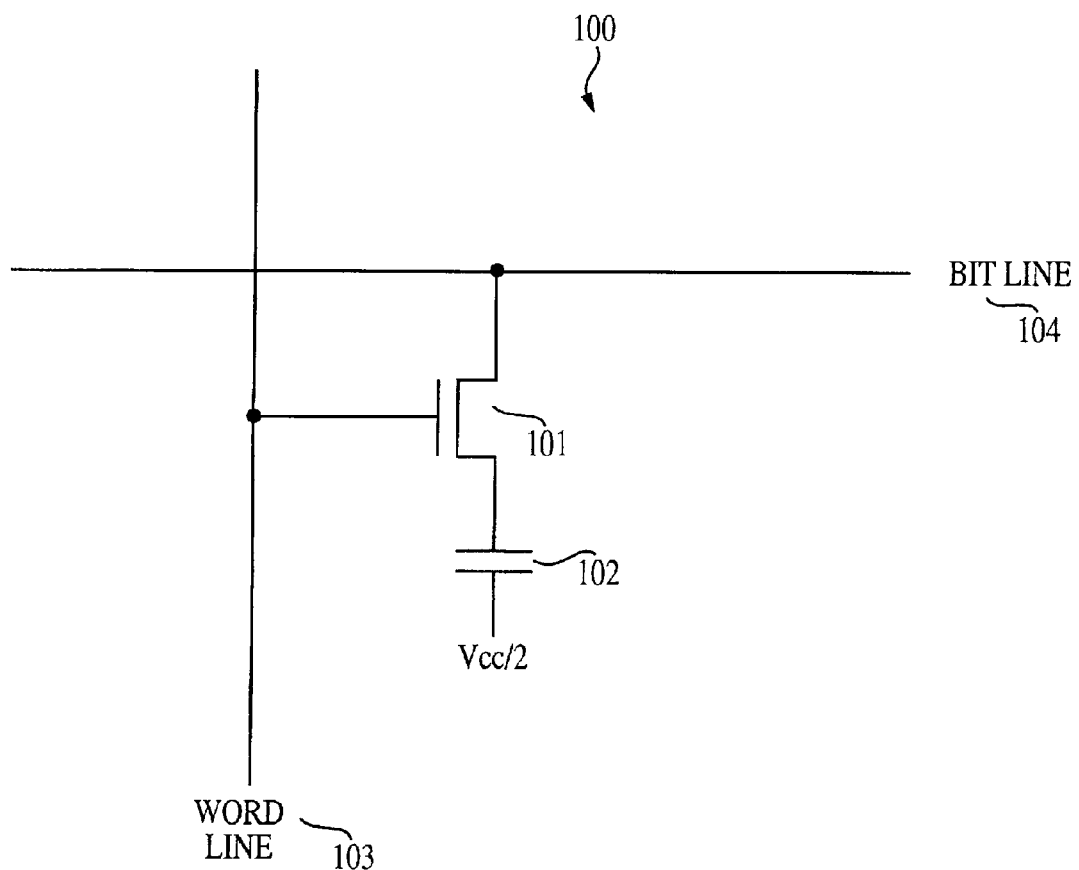
FIG. 1 is a schematic diagram of a conventional DRAM cell.
Figure 2:
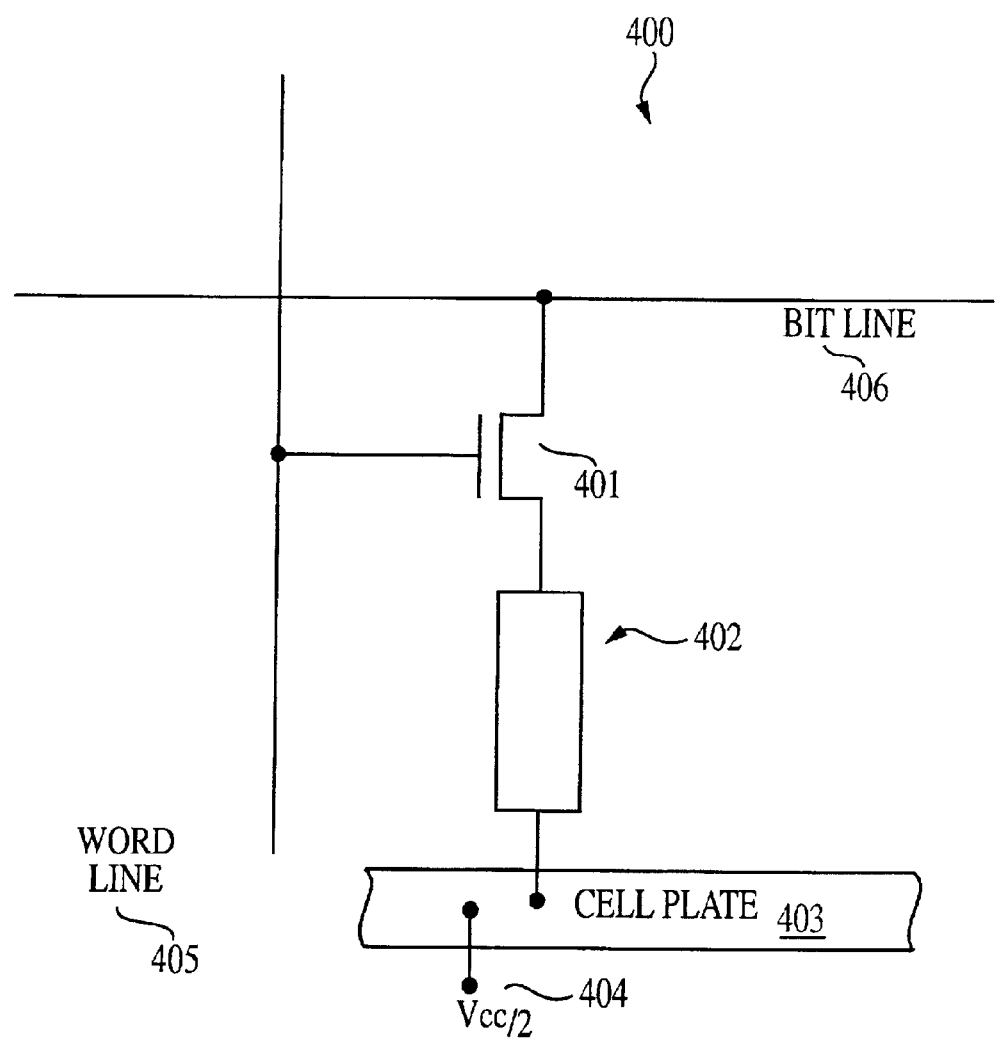
FIG. 2 is a schematic diagram of a PCRAM cell.
Figure 3:
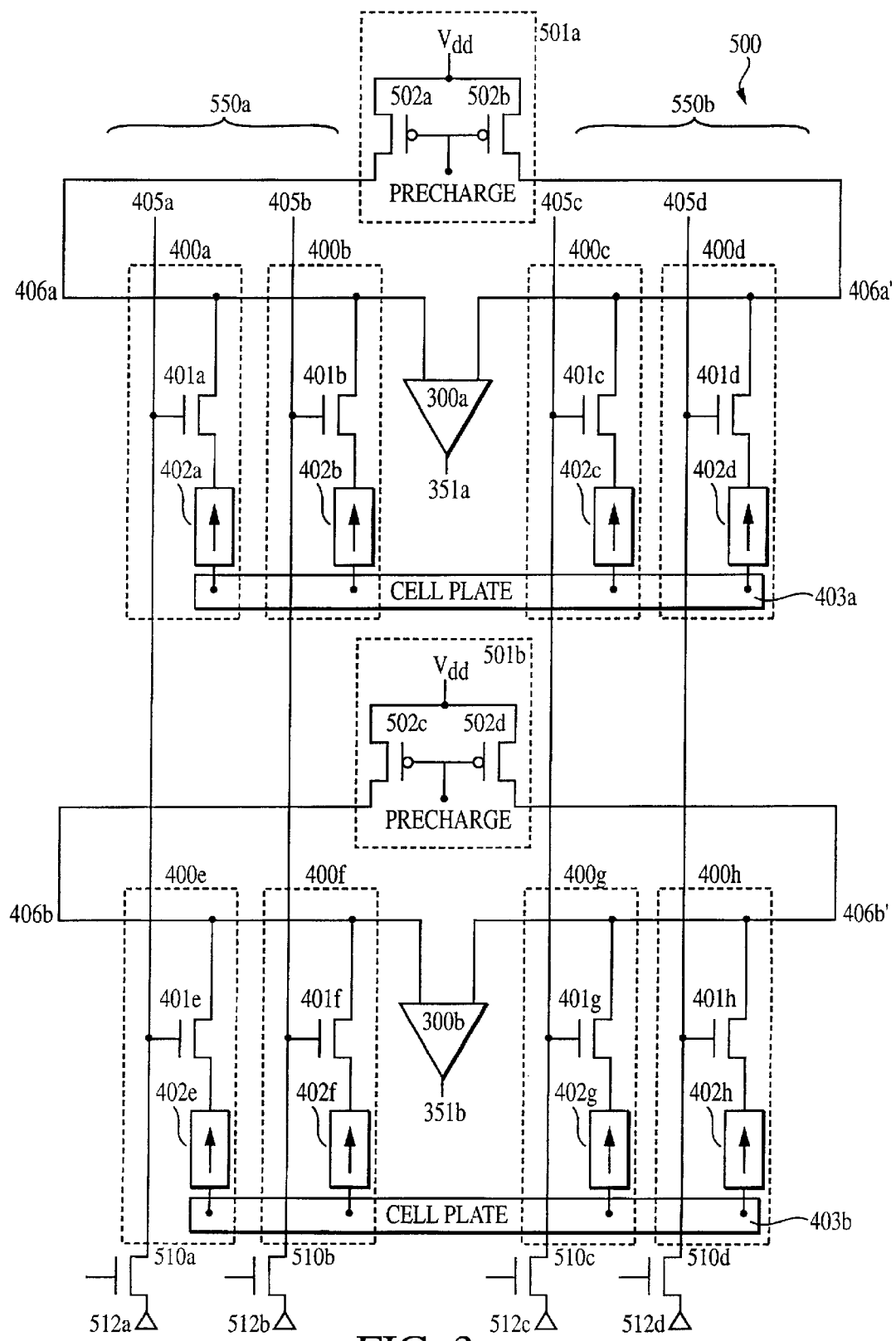
FIG. 3 is a schematic diagram a PCRAM array.

Referring to the drawings, where like reference numerals designate like elements, FIG. 2 illustrates a PCRAM cell 400 and in FIG. 3 a memory device 500 comprised of a plurality of PCRAM cells 400a–400h. As illustrated in FIG. 2, a PCRAM cell 400 comprises an access transistor 401, a programmable conductor memory element 402, and a common cell plate 403 for a plurality of cells. The access transistor 401 has its gate coupled to a word line 405 and one terminal coupled to a bit line 406. A small portion of an array of such cells is shown in FIG. 3 as including bit lines 406a, 406a', 406b, 406b', and word lines 405a, 405b, 405c, and 405d. As shown in FIG. 3, the bit lines 406a, 406a', and 406b, 406b' are coupled to respective pre-charge circuits 501a, 501b, which can switchably supply a pre-charge potential to the bit lines 406a, 406a', 406b, 406b'. The other terminal of each access transistor 401 is coupled to one end of an associated programmable conductor memory element 402, while the other end of the associated programmable conductor memory element 402 is coupled to the cell plate 403. The cell plate 403 may span and be coupled to several other PCRAM cells. The cell plate 403 is also coupled to a potential source. In the exemplary embodiment the potential source is at (Vdd/2).

The access transistor 401, as well as the other access transistors, are depicted as N-type CMOS transistors, however, it should be understood that P-type CMOS transistors may be used as long as the corresponding polarities of the other components and voltages are modified accordingly. The programmable conductor memory element 402 is preferably made of chalcogenide glass having a $Ge_x{:}Se{:}_{(1-x)}$ composition (e.g., x=0.2 to 0.3) which is doped with silver, however, it should be understood that any other bi-stable programmable conductor material known to those with ordinary skill in the art may also be used. In the exemplary embodiment of a $Ge_x{:}Se{:}_{(1-x)}$ glass where x=0.2 to 0.3, the programmable conductor memory element 402 stores a binary "0" state when it has a resistance of approximately 10 K ohm, and a binary "1" when it has a resistance greater than 10 M ohm. The programmable conductor memory element is normally at rest in a high resistive state but can be programmed to a low resistance state, e.g., binary "0" state, by applying a voltage greater than or equal to approximately +0.25 volt across the memory element. A memory element programmed to a low resistance state can be programmed to a high resistance value, e.g., a binary "1" state, by applying a voltage greater than or equal to approximately −0.25 volt across the memory element. The programmable conductor can be nondestructively read by applying a reading voltage having a magnitude of less than 0.25 volt across the memory element. In the exemplary embodiment, the reading voltage of approximately 0.2 volt can be used. However, it should be readily apparent that other alternate voltages may be selected as required for programmable conductor memory elements formed of the indicated or other material compositions.

Figure 5:
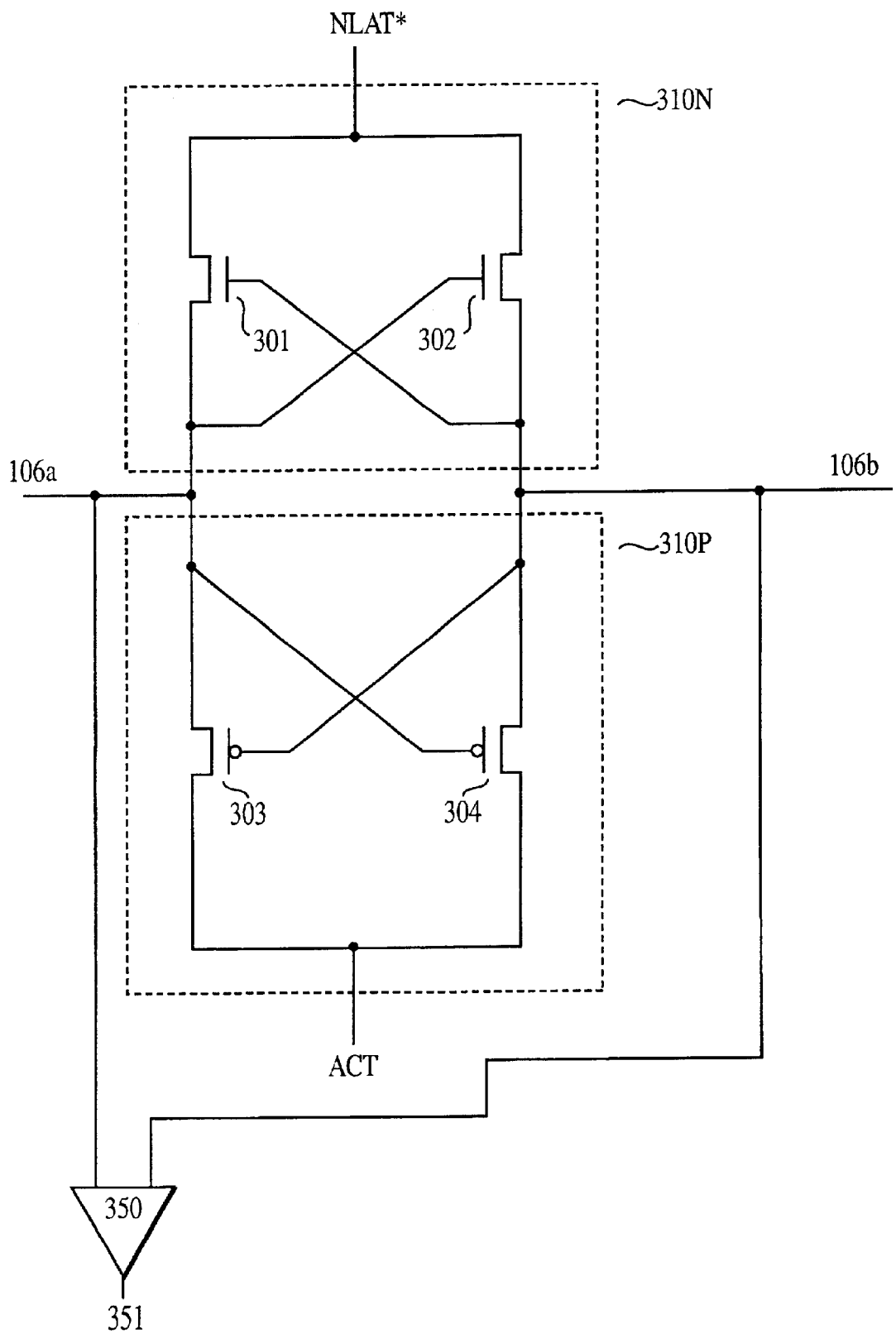
FIG. 5 is a schematic diagram of a sense amplifier used in the invention.

FIG. 3 illustrates a memory device 500 comprising a pair of memory arrays 550a, 550b. Each memory array 550a, 550b includes a plurality of memory cells 400a–400d, 400e–400h arranged such that the memory cells 400 along any given bit line 406a, 406a', 406b, 406b' do not share a common word line 405a–405d. Conversely, the memory cells 400 along any word line 405a–405d do not share a common bit line 406a, 406a', 406b, 406b'. A selected word line is switchably coupled to an associated word line driver 512a–512d via a transistor 510a–510d in accordance with the output of a row decoder. A bit line 406a, 406a', 406b, 406b' is selected for use in accordance with the output of a column decoder. Each memory array 550a, 550b has its own set of bit lines. For example, memory array 550a includes bit lines 406a, 406b, while memory array 550b includes bit lines 406a', 406b'. The bit lines from each adjacent pair of memory arrays 550a, 550b are coupled to a common sense amplifier 300a, 300b. For example, bit lines 406a, 406a' are coupled to sense amplifier 300a, while bit lines 406b, 406b' are coupled to sense amplifier 300b. For simplicity, FIG. 5 illustrates a memory device having only two arrays 550a, 550b, and eight cells 400a–400h. However, it should be understood that the illustrated memory device would typically have significantly more cells and arrays.

The memory device 500 also includes a plurality of pre-charge circuits 501a–501b. One pre-charge circuit (e.g., 501a) is shown as being provided for each pair of bit lines coupled to a sense amplifier (e.g., 406a, 406a'), however, other pre-charge arrangements are also possible. Each pre-charge circuit (e.g., 501a) includes two transistors (e.g., 502a, 502b). One terminal of each transistor is coupled to a potential source Vdd. In the exemplary embodiment, the potential source Vdd is 2.5 volts. Another terminal of each transistor (e.g., 502a, 502b) is coupled to its corresponding bit line (e.g., 406a, 406a', respectively). The gate of the each transistor (e.g., 502a, 502b) is coupled to a pre-charge control signal. As illustrated, the transistors (e.g., 502a, 502b) are P-MOS type transistor. Thus, when the pre-charge signal is low, the transistors (e.g., 502a, 502b) conduct, thereby pre-charging the bit lines (e.g., 406a, 406a'). When the pre-charge signal is high, the transistors (e.g., 502a, 502b) are switched off. Due to capacitance inherent in the bit lines (e.g., 406a, 406a'), the bit lines will hold the pre-charge voltage level of 2.5 volts for a period of time.

Reading a PCRAM cell, for example, cell 400a, in the PCRAM device 500 comprises the operations of accessing a memory element and sensing/refreshing the memory element.

During a read operation a small potential difference is created between the bit lines (e.g., 406a, 406a') coupled to the same sense amplifier (e.g., 300a) for a memory cell e.g., a 400a, being read. One of the bit lines, e.g. 406a maintains an applied pre-charge voltage as a reference for the sense amplifier 300a, while the other bit line e.g. 406a' starts with a voltage slightly higher than the pre-charge voltage due to parasitic capacitance between that bit line and an associated row line of the cell 400 being read, e.g. 400a. During a read operation for e.g. cell 400a, the voltage on bit line 406a is discharged through memory element e.g. 402a. This small potential difference between the reference voltage and the discharging voltage on bit line 406a can be sensed by sense amplifier 300a to determine the resistance and logical state of memory element 400a.

Figure 6:
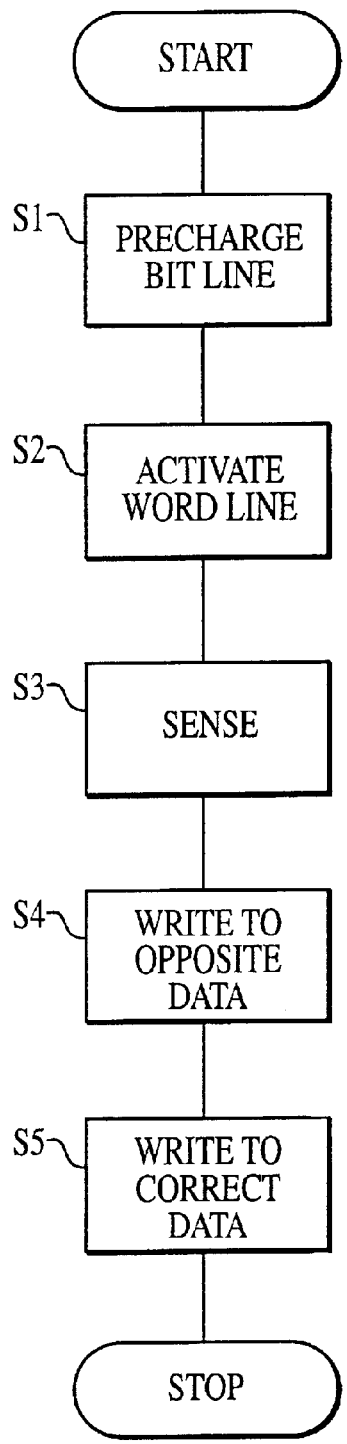
FIG. 6 depicts a flowchart describing an operational flow, in accordance with an exemplary embodiment of the invention.

Now also referring to FIG. 6, the read operation begins with the pre-charging of the bit lines 406a, 406a', 406b, 406b' of the memory device 500 via pre-charge circuits 501a–501b (step S1). The bit lines may be pre-charged by temporarily bringing the pre-charge signal low, causing transistors 502a–502d to conduct the pre-charge voltage (Vdd) to the bit lines 406a, 406a', 406b, 406b'. Once the pre-charge signal returns to a high state, the transistors 502a–502d stop conducting, but the bit lines 406a, 406a', 406b, 406b' will remain at the pre-charge potential for a predetermined period due to the capacitance inherent in the bit lines. The precharge period is illustrated as the time prior to T1 in FIGS. 4A, 4B.

In the exemplary embodiment, a selected pair of bit lines e.g. 406a, 406a', are pre-charged to 2.5 volts and the cell plate 403a, 403b is tied to 1.25 volts (Vdd/2). However, the pre-charge voltage in bit line 406a is slightly higher as noted, e.g. to 2.6 volts when row line 405a is activated. When the row line is activated at time T1 (FIGS. 4A, 4B), e.g. row line 405a, there is a voltage drop across the access transistor, e.g. 401a, which causes a voltage of approximately 0.2 volts to appear across the memory element 402a. The potential difference between the bit line 406a and the cell plate 403a will cause the bit line to discharge to the cell plate through the conducting access transistor 401 and the programmable conductor memory element 402a. The discharge rate is dependent upon the resistive state of the programmable conductor memory element 402. That is, a low resistive state will cause the voltage on selected bit line 406a to discharge faster than a high resistive state. As the bit line discharges, its voltage will fall from the original voltage of approximately 2.6 volts toward the cell plate voltage.

Figure 4A:
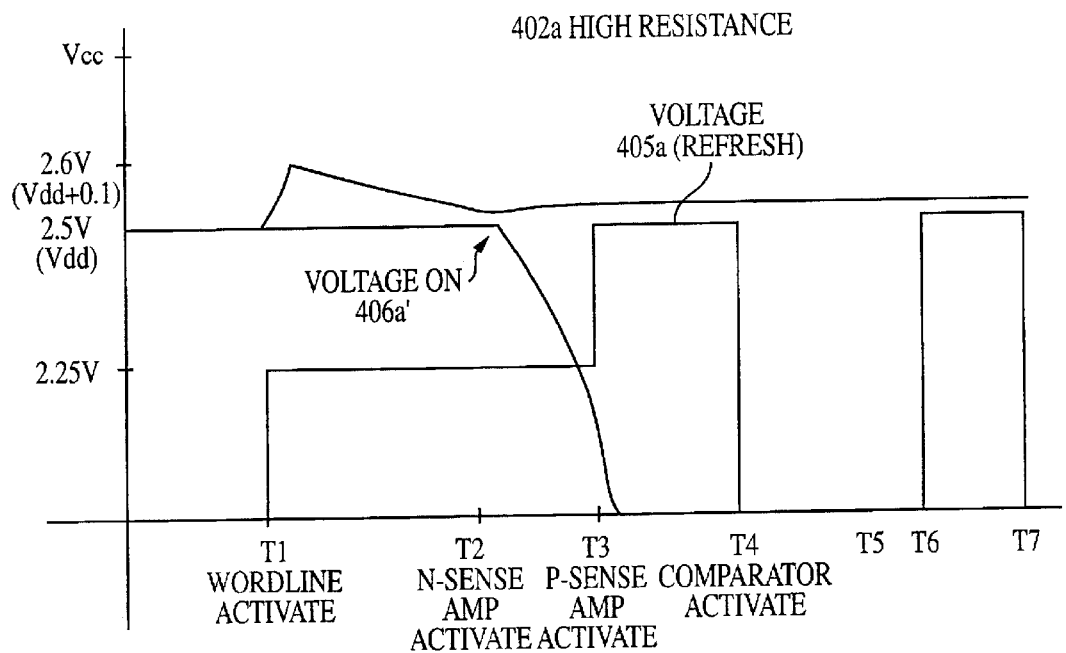
FIGS. 4A and 4B are timing diagrams illustrating the voltages on the word and bit lines when a PCRAM cell is read in high resistance and low resistance states, respectively.
Figure 4B:
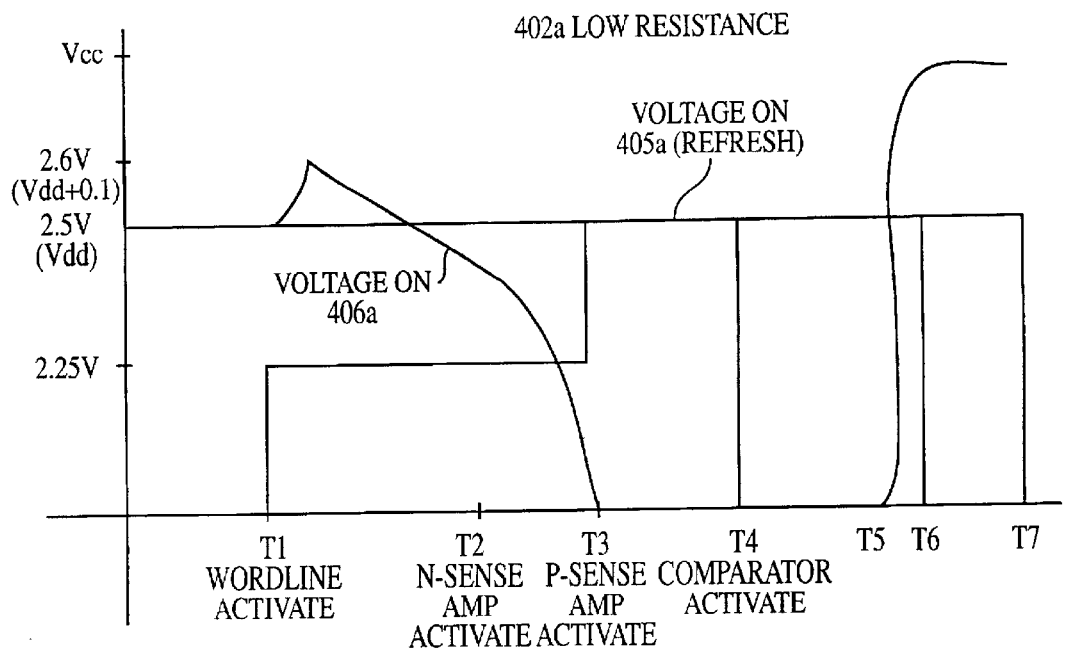

In the memory device 500, the word lines 405a–405d are normally at ground potential. Thus the access transistors 401a–401d are normally switched off. Referring now to FIGS. 4A and 4B, at time T1, the word line 405a associated with a cell 400a to be read is activated by bringing its potential from ground to a predetermined level (step S2 in FIG. 6). The predetermined level is designed to create a reading voltage at the programmable element 402a, which as previously explained, must have a magnitude less than the magnitude of a writing voltage. In the exemplary embodiment, the word line 405a is brought to approximately 2.25 volts. Since the voltage drop across the transistor 401a is approximately 1.15 volts, the potential at the interface between the transistor 401a and the programmable element 402a is 1.45 volt. This results in a reading voltage of 0.2 volt across the programmable memory element 402a since the voltage at the interface between the programmable element 402a and the cell plate 403a is maintained at 1.25 volt.

As noted, due to the inherent parasitic capacitance between the word line 401a and its associated bit lines 406a the potential in the associated bit line 406a increase as the word line 401a is activated. In the exemplary embodiment, the potential in bit line 406a increases by 0.1 volt to 2.6 volt. It should be noted that the word lines 405c, 405d coupled to complementary bit lines 406a', 406b' remain at ground potential. Thus, bit lines 406a', 406b' remain at the pre-charge potential, which is 2.5 volt in the exemplary embodiment.

The increased potential of bit line 406a is used in combination with the two bi-stable resistive states of the programmable element 402a to cause one of the bit lines (e.g., 406a) coupled to a sense amplifier (e.g., 300a) to have either a greater or lesser voltage than the other bit line (e.g., 406a') coupled to the same sense amplifier 300a. The memory is designed and operated so that if the programmable element 402a has a high resistive state, bit line 406a discharges more slowly, thereby causing it to maintain its relatively higher potential. However, if the programmable element 402a has a low resistive state, bit line 406a discharges at a faster rate, so that bit line 406 transitions to a lower potential state than bit line 406a'. These two effects can be seen by comparing FIG. 4A (illustrating the effects of a programmable element at a high resistive state) and FIG. 4B (illustrating the effects of a programmable element at a low resistive state.)

FIG. 5 is detailed illustration of a sense amplifier 300, which comprises a N-sense amp 310N and a P-sense amp portion 310P. The N-sense amp 310N and the P-sense amp 310P include nodes NLAT* and ACT, respectively. These nodes are coupled to controllable potential sources (not illustrated) which supply control signals which respectively turn on the N-sense amp 310N and the P-sense amp 310P. In an initial state, the transistors, 301–304 of the N- and P-sense amps 310N, 310P are switched off and no enabling signals are supplied to the NLAT* and ACT modes. The sense operation of sense amplifier 300 is a two phased operation in which the N-sense amp 310N is triggered before the P-sense amp 310P.

The N-sense amp 310N is triggered by bringing the potential at node NLAT* towards ground potential. As the potential difference between node NLAT* and the bit lines 106A and 106a' approach the threshold potential of NMOS transistors 301, 302, the transistor with the gate coupled to the higher voltage bit line begins to conduct. This causes the lower voltage bit line to discharge towards the voltage of the NLAT* node. Thus, when node NLAT* reaches ground potential, the lower voltage bit line will also reach ground potential. The other NMOS transistor never conducts since its gate is coupled to the low voltage digit line being discharged towards ground.

The P-sense amp 310P is triggered (after the N-sense amp 310N has been triggered) by bringing the potential at node ACT from ground towards Vdd. As the potential of the lower voltage bit line approaches ground (caused by the earlier triggering of the N-sense amp 310N), the PMOS transistor with its gate coupled to the lower potential bit line will begin to conduct. This causes the initially higher potential bit line to be charged to a potential Vdd. After both the N- and P-sense amps 310N, 310P have been triggered, the higher voltage bit line has its potential elevated to Vdd while the lower potential bit line has it potential reduced to ground. Thus, the process of triggering both sense amps 310N, 310P amplifies the potential difference created by the access operation to a level suitable for use in digital circuits. In particular, the bit line 106*a* associated with the memory cell 400*a* being read is driven to ground if the memory cell 400*a* stored a charge corresponding to a binary 0, or to Vdd if the memory cell 400*a* stored a charge corresponding to a binary 1, thereby permitting a compactor (or differential amplifier) 350*a* coupled to bit lines 106*a*, 106*a*' to output a binary 0 or 1 consistent with the data stored in the cell 400*a* on signal line 351.

Returning to FIGS. 4A and 4B, at time period T2, the N-sense amplifier 310N is activated (start of step S3). As previously noted, activating the N-sense amplifier causes the bit line (one of 406*a* and 406*a*') having the lower potential to be pulled with the NLAT signal toward ground. In the exemplary embodiment, T2 is approximately 30 nanosecond after the world line activation at T1. However, it should be noted that the timing of T2 may be varied without departing from spirit or scope of the invention.

At time period T3, the P-sense amplifier 310P is activated. As previously noted, activating the P-sense amplifier causes the bit line (one of 406*a* and 406*a*') having the higher potential to be pulled towards Vdd. In the exemplary embodiment, T3 is approximately 35 nanosecond after T1 (end of step S3). However, it should be noted that the timing of T4 may also be varied without departing from spirit or scope of the invention.

As shown in both FIGS. 4A and 4B at time T4 after both the N- and P-sense amplifies have been fired, one of the bit lines 406*a*, 406*a*' is at ground and the other is at Vdd, depending on the resistance of cell 400*a*. Since one bit line coupled to sense amplifier 300*a* is now at ground potential while the other bit line is now at Vdd potential, a comparator (or differential amplifier) 350 can be used to output a value corresponding to the contents of the cell 400*a* on signal line 351*a*.

Figure 7:
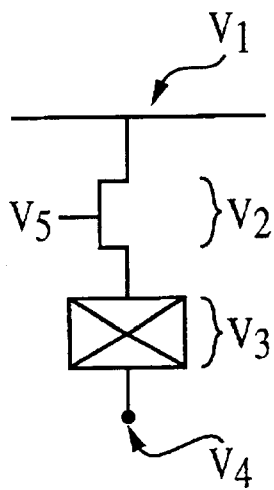
FIG. 7 depicts a voltage arrangement across the PCRAM memory cell of FIG. 2.

Next, FIG. 7 shows a voltage chart describing a re-write/refresh operation for a read memory cell 400*a* in accordance with an exemplary embodiment of the invention. In this exemplary process flow, the following parameters of the programmable conductor memory cells are presumed: i) that the voltage across an element 402 required to write from a high resistance state to a low resistance state is 0.25V; and ii) that the voltage across elements 402 required to write from a low resistance state to a high resistance state is −0.25V. It should be readily apparent that alternative voltages may be used depending on the material composition, size and construction of the programmable conductor memory element 402.

Referring back to FIG. 6 after the read operation occurs, the write process begins at step S4 by first writing to the opposite data that was sensed at step S3. Hence, if memory cell 400*a* is to be written back to a "1," state (from step S3) then the cell is first written to the opposite or complement data (i.e., "0" state), as shown in step S4, and then written back to the correct read state (i.e., "1"), as shown in step S5. Alternatively, if memory cell 400*a* is to be written back to a "0" state, then the cell is first written to the opposite data state (i.e., "1") and then written back to the correct data state (i.e., "0").

As shown in FIG. 7, and assuming Vdd=2.5 volts and Vdd/2=1.25 volts, to write a programmable memory element 402*a* to a low resistance state requires a voltage of greater than or equal to +0.25 across the memory element 402*a*. Thus, if the bit line voltage V1 is set to Vdd and the access transistor 401*a* is turned on to 2.5 volts, and if there is approximately a V2=1 volt drop or less across the transistor, the voltage V3 drop across the cell is +0.25 or higher which is sufficient to program it to a low resistance state.

If memory element 402*a* is to be written to a high resistance state, then the voltage across the memory element 402*a* must be less than −0.25 volts. To obtain this the bit line voltage V1 can be set to ground and the word line is activated. If the voltage drop V2 across the transistor is again 1 volt or less, then the voltage drop across the memory element V2=−0.25, or less which is sufficient to program a memory element to a high resistance state.

Thus, by controlling the voltage on the bit line and word line following the memory element read operation, a read memory element can be set to a particular logic state. In the invention, once a memory element 402*a* is read, it is refreshed by first writing the logic state of the memory element to its complementary state and then writing it back again to its original logic state. Thus, if a read memory element 402*a* holds a high resistance state e.g. logic "1," it is refreshed by first writing it to a low resistance state, e.g. logic "0." And then writing it again to a high resistance state e.g. logic "1."

Figure 8:
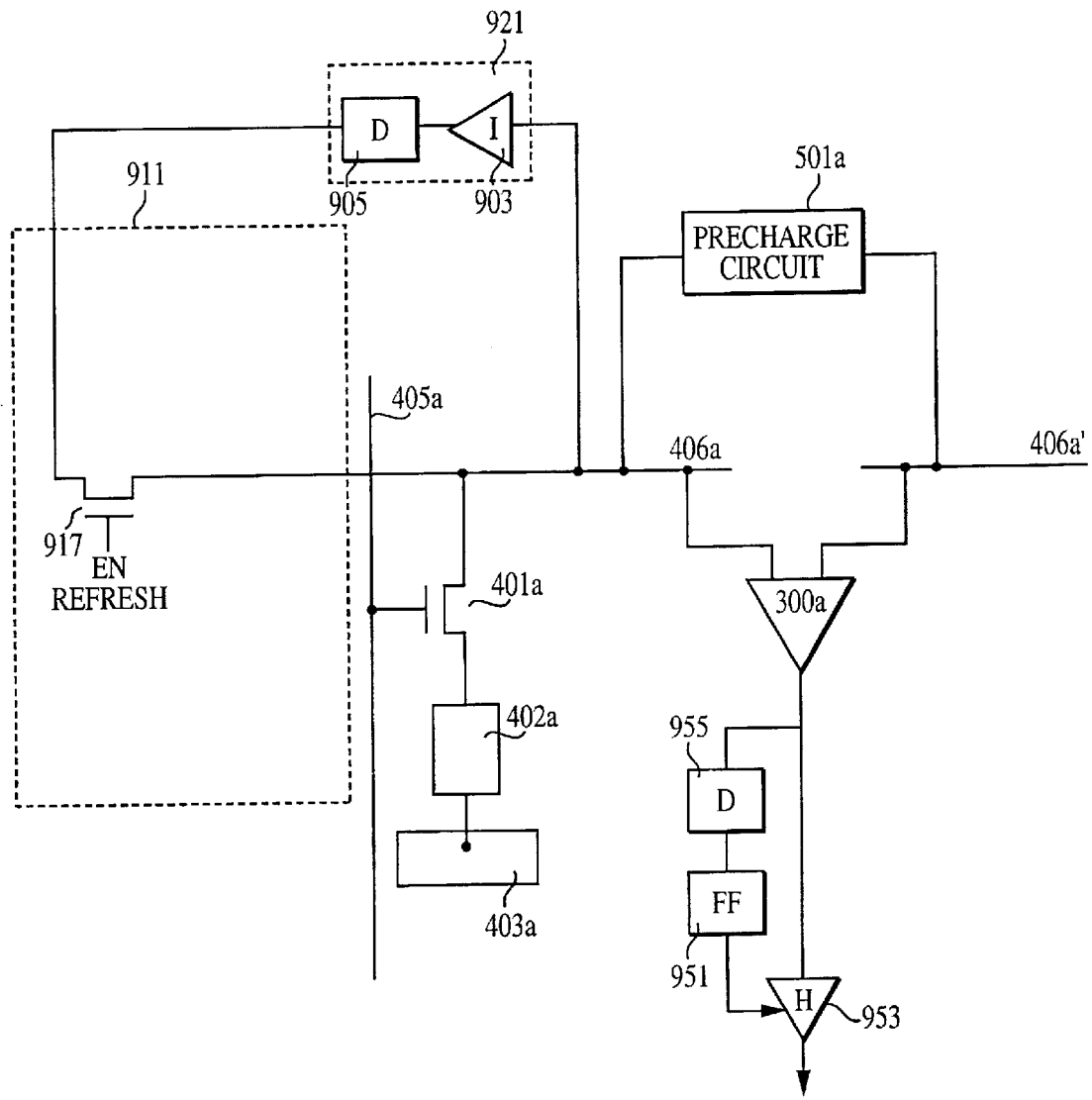
FIG. 8 is a schematic diagram of a portion of the FIG. 3 circuit with added refresh circuitry.

FIG. 8 illustrates one exemplary refresh circuit which can be used to refresh a read memory element. FIG. 8 illustrates a portion of the FIG. 3 memory structure including the memory cell 400*a* including access transistor 401*a* and memory element 402*a*. Also shown is a bit line charge circuit 911 which is used following a read operation to set bit line 406*a* to voltage of either Vdd or ground.

FIG. 8 also illustrates a refresh signal generating circuit 921 for generating the refresh signal applied to control the bit line charge circuit 911. The refresh signal generating circuit 921 includes an inverter 903 which receives an output signal from bit line 406*a* and a delay circuit 905.

The operation of the refresh circuit illustrated in FIG. 8 will now be explained with reference to the timing diagram shown in FIGS. 4A and 4B. The timing diagram of FIG. 4A shows the bit line 406*a* as having a value of Vdd after a read operation at time T4. Because the voltage on bit line 406*a* is Vdd and the word line 405*a* has been turned to 2.5V, the high resistance state of memory element 402*a* is read, and the Vdd on the bit line will cause the memory element to see +0.25 volts across it which will automatically program it to a low resistance state before time T4 when a read operation is completed. In order to reprogram the memory element back to a high resistance state, the bit line 406*a* is brought to ground by an inversion of the Vdd value in inverter 903 and application of the inverted bit line 406*a* voltage as an input to bit line charge circuit 911 and drop the bit line voltage to ground at time T5. Then, if word line 405*a* is then enabled, as shown at time T6 in FIG. 4A, there will be a negative 0.25 volt across the memory element 402*a* which is sufficient to reprogram it back to a high resistance state. Although FIG. 4A shows word line 405*a* disabled at time T4 and re-enabled at time T6, it is also possible to keep word line 405*a* enabled through the time period T4 to T7. Likewise, as shown in FIG. 4B if the memory element 402*a* originally held a low resistance value, prior to time T4, the ground voltage on the bit line 406*a* produced by the sense amplifier 300*a* will produce a negative 0.25 volts across the memory element 402*a* automatically programming it to a high resistance state. The ground voltage on the bit line 406*a* is converted to a Vdd voltage by inverter 903 and the delayed inverted signal is applied to bit line charge circuit 911 to apply a voltage of Vdd to bit line 406*a* at T5. Then word line 405*a* is enabled at T6 to program the memory element 402*a* back to a low resistance state. Again, word line 405*a* in FIG. 4B can also remain enabled during the period T4 to T7 if desired.

An enable transistor 917 controlled by an applied enable signal can be used to enable or disable operation of the bit line charge circuit 911 by a refresh operation.

The invention may also be used to only write a complementary resistance value a back to a memory element after a read operation. This can be implemented by eliminating the bit line charge circuit 911 and refresh signal generating circuit 921 in FIG. 8 and only performing the first write operation illustrated in FIGS. 4A, 4B, that is, the refresh operation up to time T4. In this embodiment, each time a read operation occurs, the memory element is refreshed to its complementary logic state. With this embodiment a flip flop 951 or other logic element receiving a delayed output from the sense amplifier 300*a*, is used to control an output data inverter 953 to enable/disable the inverter to ensure a proper logic state is output from a memory element 402*a*. For example, if the original logic value stored in memory element 402*a* is a "1," when this value is read out the first time the memory element 402*a* will be refreshed with a logic "0" value. The "1" data output from sense amplifier will be sensed, after a delay by delay element 953, and flip flop 951 will be toggled from a "0" to a "1" value. The next time memory element 402*a* is read, the stored logic value of "0" needs to be output as a "1" and flip flop 951 which now holds a "1" value enables inverter 953 so that the read "0" value from memory element 402 is correctly output as a logic "1" value. The output of the sense amplifier is again delayed and used to toggle flip flop 951 back to a "0" state which will not enable inverter 953 on a subsequent read operation. Since the "0" read by sense amplifier 300*a* will be rewritten in memory element 402*a* as a "1," the next time the memory element 402*a* is read the stored "1" value will be read out and not inverted. This process repeats for each read of memory element 402*a*.

Figure 9:
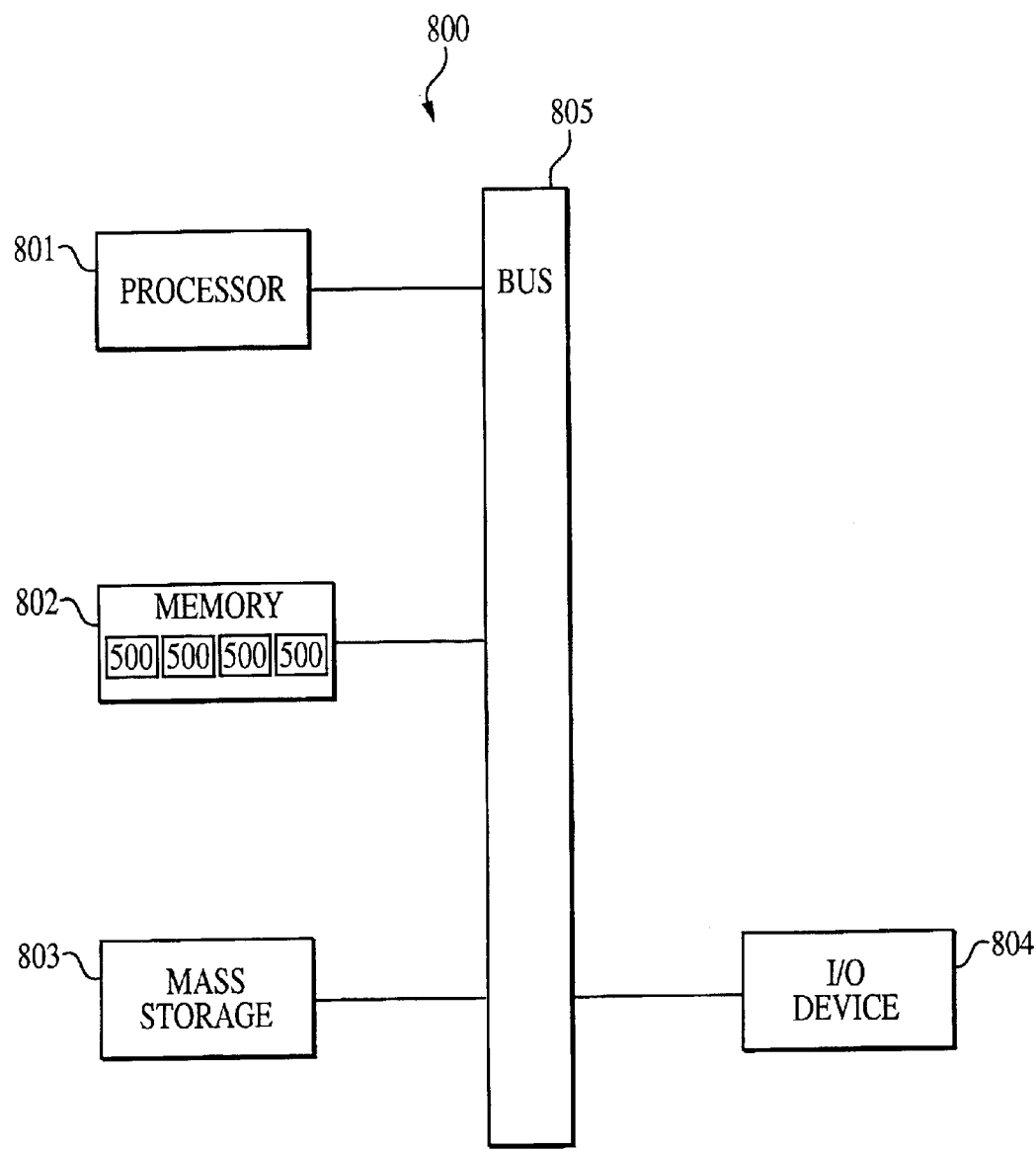
FIG. 9 is a block diagram of a processor based system including a PCRAM memory device in accordance with the principles of the present invention.

FIG. 9 is a block diagram of a processor based system 800, such as a computer system, containing a PCRAM semiconductor memory 802 as described in connection with the other figures. The memory 802 may be constituted as one or more memory chips or memory integrated circuits mounted on a memory module, for example, a plug-in memory module such as a SIMM, DIMM, or other plug-in memory module. The processor based system 800 includes a processor 801, a memory 802, a mass storage 803, and an I/O device 804, each coupled to a bus 805. While a single processor 801 is illustrated, it should be understood that processor 801 could be any type of processor and may include multiple processor and/or processors and co-processors. Memory 802 is illustrated in FIG. 9 as having a plurality of PCRAM devise 500. However, memory 802 may only include a single PCRAM device 500, or a larger plurality of PCRAM devices 500 than illustrated, and/or may include additional forms of memories, such as non-volatile memory or cache memories. While one mass storage 803 device is illustrated, the processor based system 800 may include a plurality of mass storage devices, possibly of varying types such as, but not limited to, floppy disks, CDROMs, CD-R, CD-RW, DVD, hard disks, and disk arrays. I/O device 804 may likewise comprise a plurality of I/O devices of varying tepes, including, but not limited to keyboard, mouse, graphic cards, monitors, and network interfaces. Bus 805, while illustrated as a single bus may comprise a plurality of buses and/or bridges, which may be coupled to each other or bridged by other components. Some of the devices 801–804 may be coupled to only a single bus 805, others may be coupled to a plurality of buses 805.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. For example, many different types of equivalent circuits can be used to supply the appropriate read and write voltages to the memory cells, e.g. 400*a*. Accordingly, the invention is not limited by the foregoing description or drawings of specific exemplary embodiments, but is only limited by the scope of the appended claims.

What is claimed as new and desired to be protected by Letters Patent of the United States is:

1. A memory device comprising,
   a programmable conductor memory element;
   an access circuit for coupling said memory element between an activated word line and an activated bit line during a read operation;
   a sense amplifier coupled to said activated bit line for sensing a first logical state of said memory element; and
   writing circuitry for writing said memory element first to a complement logical state of said first logic state in response to said read operation and then writing said memory element back to said first logical state.

2. The memory device of claim 1, wherein said first logical state is a first higher resistance state and the complement logical state is a second lower resistance state.

3. The memory device of claim 1, wherein said first logical state is a first lower resistance state and the complement logical state is a second higher resistance state.

4. The memory device of claim 1, further comprising a pre-charge circuit for pre-charging the activated bit line and a reference bit line prior to a sensing operation of said sense amplifier, wherein said activated bit line and said reference bit line are coupled to the sense amplifier.

5. The memory device of claim 1, wherein said writing circuitry further comprises a bit line charge circuit for setting a voltage for said bit line.

6. The memory device of claim 5, wherein said writing circuitry further comprises a refresh signal generating circuit for generating a refresh signal applied to control said bit line charge circuit.

7. The memory device of claim 1, wherein said access circuit comprises a transistor.

8. The memory device of claim 1, wherein said programmable conductor memory element comprises a chalcogenide glass.

9. The memory device of claim 8, wherein said chalcogenide glass comprises a Ge:Se: glass composition which is doped with silver.

10. A programmable conductor memory circuit comprising:
    a programmable conductor memory element;
    an access device for enabling a read and write access to said memory element; and
    a circuit for operating said access device to read a logical value stored in said memory element and then, in response to reading said stored logical value, to write a complementary logic value into said memory element.

11. The memory circuit of claim 10, further comprising:
a bit line and a sense amplifier coupled to said bit line and to a reference voltage line during at least a read access of said memory element, said sense amplifier sensing a logic state of said memory element and setting said bit line at a predetermined voltage depending on a sensed logic state of said memory element; and
said circuit enabling said access device to couple said memory element between a voltage source and said bit line for a read operation and for enabling said access device to couple said memory element between said voltage source and said bit line after said sense amplifier sets said bit line at said predetermined voltage.

12. The memory of claim 10, further comprising a logic circuitry for keeping track during a read operation whether the read logical value should be output as read or inverted before being output.

13. The memory of claim 12, wherein said logic circuitry further comprises a flip flop to control an output data inverter to output a proper logic value.

14. The memory device of claim 11, further comprising a pre-charge circuit for pre-charging said bit line and said reference voltage line prior to a sensing operation of said sense amplifier.

15. The memory device of claim 10, wherein said access device comprises a transistor.

16. The memory device of claim 10, wherein said programmable conductor memory element comprises a chalcogenide glass.

17. The memory device of claim 16, wherein said chalcogenide glass comprises a Ge:Se: glass composition which is doped with silver.

18. A processor based system comprising,
a processor; and
a memory coupled to said processor, said memory comprising:
a programmable conductor memory element;
an access circuit for coupling said memory element between an activated word line and an activated bit line during a read operation;
a sense amplifier coupled to said activated bit line for sensing a first logical state of said memory element; and
writing circuitry for writing said memory element first to a complement logical state of said first logic state in response to said read operation and then writing said memory element back to said first logical state.

19. The system of claim 18, wherein said first logical state is a first higher resistance state and the complement logical state is a second lower resistance state.

20. The system of claim 18, wherein said first logical state is a first lower resistance state and the complement logical state is a second higher resistance state.

21. The system of claim 18, further comprising a pre-charge circuit for pre-charging the activated bit line and a reference bit line prior to a sensing operation of said sense amplifier, wherein said activated bit line and said reference bit line are coupled to the sense amplifier.

22. The system of claim 18, wherein said writing circuitry further comprises a bit line charge circuit for setting a voltage for said bit line.

23. The system of claim 22, wherein said writing circuitry further comprises a refresh signal generating circuit for generating a refresh signal applied to control said bit line charge circuit.

24. The system of claim 18, wherein said access circuit comprises a transistor.

25. The system of claim 18, wherein said programmable conductor memory element comprises a chalcogenide glass.

26. The system of claim 25, wherein said chalcogenide glass comprises a Ge:Se: glass composition which is doped with silver.

27. A processor based system comprising,
a processor; and
a memory coupled to said processor, said memory comprising:
a programmable conductor memory element;
an access device for enabling a read and write access to said memory element; and
a circuit for operating said access element to read a logical value stored in said memory device and then, in response to reading said stored logical value, to write a complementary logic value into said memory element.

28. The system of claim 27, further comprising:
a bit line and a sense amplifier coupled to said bit line and to a reference voltage line during at least a read access of said memory element, said sense amplifier sensing a logic state of said memory element and setting said bit line at a predetermined voltage depending on a sensed logic state of said memory element; and
said circuit enabling said access device to couple said memory element between a voltage source and said bit line for a read operation and for enabling said access device to couple said memory element between said voltage source and said bit line after said sense amplifier sets said bit line at said predetermined voltage.

29. The system of claim 27, further comprising a logic circuitry for keeping track during said read operation whether the read logical value should be output as read or inverted before being output.

30. The system of claim 29, wherein said logic circuitry further comprises a flip flop to control an output data inverter to output a proper logic value.

31. The system of claim 27, further comprising a pre-charge circuit for pre-charging said bit line and said reference voltage line prior to a sensing operation of said sense amplifier.

32. The system of claim 27, wherein said access device comprises a transistor.

33. The system of claim 27, wherein said programmable conductor memory element comprises a chalcogenide glass.

34. The system of claim 33, wherein said chalcogenide glass comprises a Ge:Se: glass composition which is doped with silver.

35. A method for operating a programmable conductor random access memory element, said method comprising:
sensing a logical value stored in said memory element;
writing a logical value which is the complement of the read logical value to said memory element in response to said act of sensing.

36. The method of claim 35, further comprising the act of writing said sensed logical value after writing said complement logical value.

37. The method of claim 35, wherein said read logical value is stated in said memory element as a resistance value.

38. The method of claim 35, wherein said programmable conductor memory cell comprises a chalcogenide glass.

39. The method of claim 38, wherein said chalcogenide glass comprises a Ge:Se: glass composition which is doped with silver.

40. A method for writing data to a programmable conductor random access memory element, said method comprising:

pre-charging a first bit line coupled to the programmable conductor random access memory element to a first voltage value;

pre-charging a second bit line to a second voltage value, said first value being different from said second value;

enabling an access transistor to couple the programmable conductor memory element to said first bit line;

sensing voltage on said first bit line and said second bit line to determine a first logical state of said programmable conductor memory element; and writing a second logical state complementary to said first logical state to said memory element after said first logical state is determined.

41. The method of claim 40, wherein said programmable conductor memory element comprises a chalcogenide glass.

42. The method of claim 41, wherein said chalcogenide glass comprises a Ge:Se: glass composition which is doped with silver.

* * * * *